United States Patent [15] 3,660,774
Eachus [45] May 2, 1972

[54] SINGLE STAGE DIFFERENTIAL AMPLIFIER

[72] Inventor: Joseph J. Eachus, Cambridge, Mass.
[73] Assignee: Honeywell Inc., Minneapolis, Minn.

[22] Filed: Dec. 16, 1969
[21] Appl. No.: 885,597

[52] U.S. Cl. ................................330/30 D, 307/235, 330/69
[51] Int. Cl. ..........................................................H03f 3/68
[58] Field of Search ..........................328/146, 147; 307/235; 330/30 R, 40, 30 D, 69

[56] References Cited

UNITED STATES PATENTS

| | | | |
|---|---|---|---|
| 3,178,651 | 4/1965 | Kegelman | 330/30 X |
| 3,441,868 | 4/1969 | Anderson | 330/40 X |
| 3,531,730 | 9/1970 | Steckler | 330/19 X |

*Primary Examiner*—Roy Lake
*Assistant Examiner*—James B. Mullins
*Attorney*—Fred Jacob and Ronald T. Reiling

[57] ABSTRACT

A single stage differential amplifier provides an output voltage proportional to the algebraic difference between a pair of input voltages.

17 Claims, 4 Drawing Figures

INVENTOR
JOSEPH J. EACHUS
BY
Keith F. Driscoll
ATTORNEY

SINGLE STAGE DIFFERENTIAL AMPLIFIER

BACKGROUND OF THE INVENTION

This invention relates to amplifiers and, more particularly, to a single stage differential amplifier which provides an output signal proportional to the algebraic difference between a pair of input signals.

In general, single stage differential amplifiers have been employed in numerous applications; for example, in analog systems, as signaling amplifiers; in communication systems, as line receiver amplifiers; and, in memory systems, as sense amplifiers. These amplifiers when so employed are connected to provide, as an output, amplified small differences in amplitude between the pair of input signals applied to the different input terminals thereof. U.S. Pat. No. 3,440,440 illustrates a single stage differential amplifier stage utilized in one of the applications mentioned above.

In virtually all instances, the single stage amplifiers require that the pair of input signals be so applied to the amplifier terminals as to have a predetermined relationship to one another thereby enabling the amplifier to conduct. Accordingly, these amplifiers are normally unable to provide a difference output signal proportional to the algebraic difference between the pair of input signals. It is to be noted that applying the input signals to the input terminals of the single stage amplifier reduces the noise rejection qualities of the stage because it amplifies any difference between the common mode signals (i.e. noise signals common to both terminals). Furthermore, the subject input arrangement of the differential amplifier reduces the amount of signal swing caused by common mode signals expressed as a percentage of the circuit supply voltage that the amplifier can tolerate.

In order to provide the algebraic difference waveform of the present invention, it has been necessary to employ apparatus comprising at least two amplifier stages in contrast to a single amplifier stage. The two stage arrangement, input signals are normally applied to the input terminals of a first differential amplifier stage. The differential outputs from this stage, in turn, are applied to a second stage which produces a non-differential waveform corresponding to the desired difference waveform. Obvious disadvantages for this type of apparatus is the increased complexity resulting from the increased number of amplifier stages attendant with concomitant cost.

Accordingly, it is an object of the present invention to provide an improved single stage differential amplifier.

It is a further object of the present invention to provide an amplifying device which produces an output signal that represents an algebraic difference in amplitude between a pair of input signals.

It is a still further object of the present invention to provide a differential amplifier with improved noise rejection qualities and one which can be economically fabricated using integrated circuit techniques.

SUMMARY OF THE INVENTION

The foregoing and other objects of the present invention are accomplished by a single stage differential amplifying device which has first and second input signals applied respectively to an input control terminal and an output terminal. Values of the impedances which comprise the device are selected to produce directly the desired difference signal; namely, a signal whose amplitude is proportional to the algebraic difference between the first and second input signals.

By eliminating the additional stages of the prior art, the number of components which make up the overall differential amplifying device is reduced to a minimum. This increases the reliability of the amplifier and also reduces its power consumption in addition to reducing its cost. Accordingly, the amplifying device of the present invention can be economically fabricated using integrated circuit techniques.

In an alternate embodiment of the present invention, the single stage differential amplifying device is biased to operate as either a line receiver or memory sense amplifier.

In both embodiments, an impedance divider network reduces an amplitude of a first of the two input signals which is then passed through the amplifier without amplification of noise signals associated therewith. The second of the two input signals is applied through an impedance to the output terminal and combined with the first to produce a resultant signal whose amplitude is proportional to the algebraic difference between the amplitude of the two. Since the amplifying device of the present invention does not amplify the resultant difference signal, it realizes improved noise rejection qualities and it is able to tolerate a higher percentage of common mode signal swing.

The above and other objects of the present invention are achieved in several illustrative embodiments described hereinafter. Novel features which are believed to be characteristic of the invention, both as to its organization and method of operation, together with further objects and advantages thereof will be understood from the following description considered in connection with the accompanying drawings. It is to be expressly understood, however, that each of the drawings are for the purpose of illustration and description only and are not intended as a definition of the limits of the invention.

Figure 1:
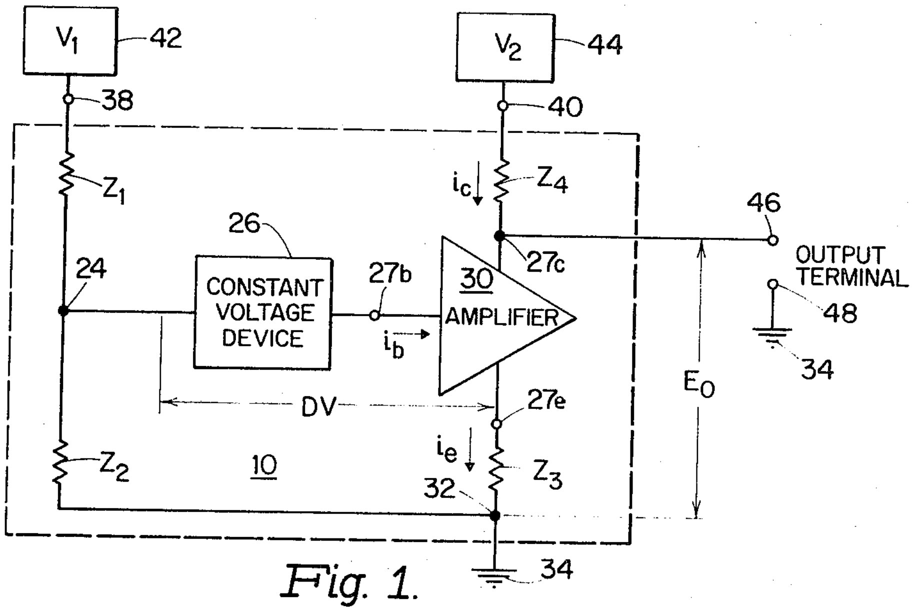
FIG. 1 is a schematic diagram of a single stage differential amplifier according to the present invention.
Figure 2:
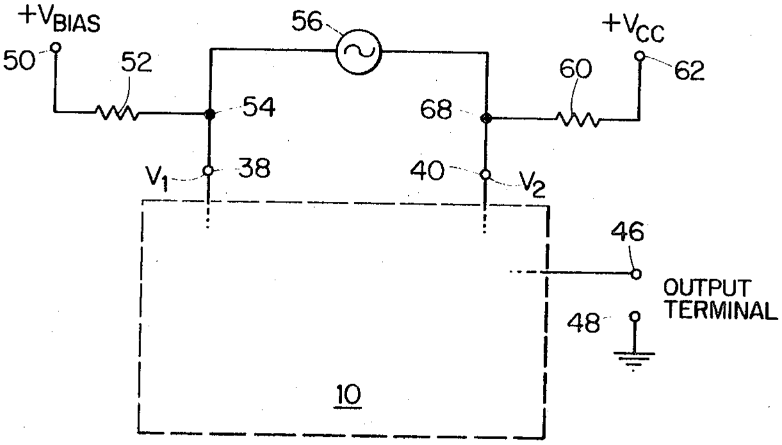
Figure 1A:
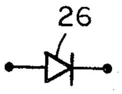
Figure 1B:
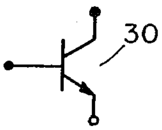

FIG. **1*a* illustrates in greater detail one form of device 26 in FIG. 1**;

FIG. **1*b* illustrates in greater detail one form of the amplifier 30 of FIG. 1; and, FIG. 2** is a schematic diagram of an alternate embodiment of the single stage amplifier of the present invention.

DESCRIPTION OF ILLUSTRATIVE EMBODIMENTS

FIG. 1 discloses an amplifier stage 10 which includes an output terminal 46, and a pair of terminals 38 and 40 which receive respectively a pair of voltages $V_1$ and $V_2$. These voltages are supplied by a pair of input voltage generators 42 and 44. A third terminal 32 of the stage 10 connects directly to a reference potential 34, labeled as ground in FIG. 1.

In greater detail, the amplifier stage 10 comprises a single amplifying device 30 which is connected in a common (grounded) emitter configuration. In the illustrated embodiment, the amplifying device 30 constitutes a single transistor amplifier, either npn or pnp conductivity. The transistor amplifier 30 has first, second, and third electrodes labeled **27*e*, 27*b*, and 27*c*** which correspond respectively to the emitter, base, and collector electrodes.

The voltage divider network consisting of a pair of series connected impedances $Z_1$ and $Z_2$ decreases the input voltage potential *V*1 to a smaller voltage potential in the ratio of the two impedances. The smaller voltage appearing at a junction 24 formed by the impedances $Z_1$ and $Z_2$ is supplied through a constant voltage device to the base electrode **27*b***.

An impedance $Z_3$ connects the emitter electrode **27*e* to ground potential 34. An impedance $Z_3$ applies the voltage $V_2$ to the collector electrode 27*c*, referenced in FIG. 1 as output terminal 46**.

The values for the impedances $Z_1$, $Z_2$, $Z_3$, and $Z_4$ are selected to have the voltage Eo which appears at output terminal 46 proportional to the algebraic difference between the input voltages $V_1$ and $V_2$ when the amplifier is biased for operation in its linear region.

In order to illustrate the relationship between the values of impedances selected for the amplifier stage 10, a brief analysis is given below. This analysis is based on several assumptions. The first is at the collector/base current gain (Beta) of the transistor amplifier 30 is sufficiently large for a current referenced as *ib* in FIG. 1 flowing through base electrode **27*b*** to be considered negligible in comparison with the currents, referenced as *ie* and *ic* in FIG. 1, flowing respectively through the emitter and collector electrodes 27e and 27c. A further assumption is that the input impedance of amplifying device 30; that is, the input impedance looking into base electrode 27b is large compared with impedance $Z_2$. A still further assumption is that a load impedance connected between terminals 46 and 48 is large compared with the impedance $Z_4$.

In the amplifier stage 10, the impedances $Z_1$, $Z_2$, $Z_3$, and $Z_4$ have respectively fixed impedance values of $Z_1$, $Z_2$, $Z_3$, and $Z_4$. The equation for the output voltage labeled as *Eo* in FIG. 1, of amplifier stage 30 with the above approximations is as follows:

$$Eo=V_2-V_1\cdot[Z_2\cdot Z_4/(Z_1+Z_2)\cdot Z_3]+DV\cdot Z_4/Z_3. \quad (1)$$

Equation 1 is derived as follows. First, the voltage $VZ_3$ developed across impedance $Z3$ is given by the following equation:

$$VZ_3=V_1\cdot Z_2/(Z_1+Z_2)-DV. \quad (2).$$

It follows that the current, $1_e$, through impedance $Z_3$ is given by the equation:

$$Ie=1/Z_3\cdot[V_1\cdot Z_2/(Z_1+Z_2)-DV]. \quad (3)$$

Since the current *ib* approximates 0, the current $i_e$ is approximately equal to the emitter current, $i_e$. Therefore, the voltage *Eo* is given by the equation:

$$Eo=V_2-Ie\cdot Z_4. \quad (4)$$

Substituting the value for $i_e$ of equation (3) into equation (4), *Eo* is as defined by equation (1).

When the term within the set of brackets be given by the equation:

$$Z_2\cdot Z_4/(Z_1Z_2)\cdot Z_3=1, \quad (5)$$

the output voltage *Eo* is given by the equation:

$$Eo=V_2-V_1+DV\cdot Z_4/Z_3. \quad (6)$$

As illustrated by equation (6), the output voltage *Eo* is proportional to the algebraic difference between the voltages $V_1$ and $V_2$. It will be noted that the output voltage *Eo* is referenced to a constant voltage of $DV\cdot Z_4/Z_3$. This term *DV*, as shown in FIG. 1, corresponds to the voltage drop across a constant voltage device 26 which may take the form of either a semiconductor diode or a zener diode. The diode is utilized to introduce added stability to the circuit and to increase the operating voltage range of voltage $V_1$.

However, where it is desirable to have the output voltage more proportional to the algebraic difference between the voltages $V_1$ and $V_2$, the constant voltage device 26 is eliminated. Accordingly, the term *DV* in equation (6) closely approximates 0 volts. In fact, an additional diode can be inserted in series with the impedance $Z_4$ in order to cancel the voltage drop *DV* across the base to emitter terminals 27b and 27e.

When the transistor amplifying device 30 comprises an npn transistor, the voltages $V_1$ and $V_2$ are positive. For a pnp transistor, both voltages *V*1 and $V_2$ are negative. Assuming transistor amplifier 30 is a npn transistor, the positive input voltage potential $V_1$, applied to terminal 38 is decreased by the ratio of the impedances $Z_1$ and $Z_2$. The positive voltage at junction 24, decreased by the voltage drop between the base and emitter terminals, *DV*, (i.e. absent element 26) increases the current $i_e$, through emitter impedance $Z_3$. The emitter current $i_e$, approximately equal to the collector current $i_c$ flowing through impedance $Z_4$, decreased proportionally the positive voltage, $V_2$, by an amount equal to the voltage drop across the collector impedance Z4. Hence, when the input voltages $V_1$ and $V_2$ are applied to the terminals 38 and 40, their combined effect is to provide an output voltage which is proportional to the algebraic difference between the two voltages.

As mentioned previously, the term in parenthesis of equation (1) must have a value of 1 in order to have the output voltage *Eo* directly proportional to the difference between voltages $V_1$ and $V_2$. The method of accomplishing this is to select the values for impedances $Z_1$, and $Z_2$, and the values for impedances $Z_3$ and $Z_4$ as ratios of one another. Specifically, let impedances *Z*1 and *Z*4 be expressed as follows:

$$Z_1=K1\cdot Z_2;\text{ and,} \quad (7)$$

$$Z_4=K2\cdot Z_3,\text{ where } K1 \text{ and } K2 \text{ are constants.}$$

Substituting these values for $Z_1$ and $Z_4$ into equation (5), and solving for *K*2, it is noted that *K*2 is given by the equation:

$$K2=(K1+2). \quad (9)$$

Let the constant $K1=P$, a constant; and it follows that $K2+(P+1)$.

Substituting *P* and *P*+1 for constants *K*1 and *K*2, respectively into equations (7) and (8), the values for impedances $Z_1$, $Z_2$, $Z_3$, and $Z_4$ are as follows:

$$Z_1=PZ_1;$$
$$Z_2=Z_1;$$
$$Z_3=Z_3;\text{ and}$$
$$Z_4=(P+1)Z_3.$$

It should be noted that when the impedances $Z_1$, $Z_2$, $Z_3$, and $Z_4$ are made resistive, and the impedance $Z_2$ has a value *R*1 and impedance $Z_3$ has a value *R*2, the resistive values of each of the impedances are as follows:

$$Z_1=PR1;$$
$$Z_2=R1;$$
$$Z_3=R2;\text{ and}$$
$$Z_4=(P+1)R2.$$

As mentioned previously, the transistor amplifier 30 must be operated within its linear region and therefore between the limits of cutoff and saturation. At cutoff, the voltage across emitter impedance $Z_3$ equals zero. The voltage across impedance $Z_3$ ($VZ_3$) is defined by the following equation:

$$VZ_3=V_1/(P+1)-DV \text{ or } 1/(P+1)[V_1-DV(P+1)]. \quad (10)$$

At cutoff, the term $V1-DV(P+1)$ must be equal to 0. Therefore, $V_1$ is defined as follows:

$$V_1=DV(P+1). \quad (11)$$

It will be noted that in order for the transistor amplifier 30 to conduct, $V_1$ must be greater than $DV(P+1)$.

The other limit mentioned above is saturation in which the output voltage Eo equals the voltage drop across emitter impedance $Z_3$. Stated differently, at saturation, the voltage drop across the collector to emitter terminals 27c and 27e (i.e. *Vce*) equals 0. Hence, *Eo* is given by the equation:

$$Eo=V_2-V_1+DV\cdot(P+1).$$

Since $Eo=VZ_3$ which is given by the equation:

$$VZ_3=V_1/(P+1)-DV,\text{ then, } V1/(P+1)-DV=V_2-V_1+DV\cdot(P+1).$$

Solving for *V*2, the equation for *V*2 is:

$V_2=1/(P+1)\cdot[V_1\cdot(P+2)-DV(P+1)(P+2)]$ and simplifying, the term $V_2$ is defined by the equation:

$$V_2=V_1\cdot(P+2)/(P+1)-DV\cdot(P+2). \quad (23)$$

Accordingly, to prevent saturation, $V_2$ must be greater than $V_1\cdot(P+2)/(P+1)-DV(P+2)$.

The transistor amplifying device 30 operates in it linear region when the voltages $V_1$ and $V_2$ have values between those given by equations (11) and (12). It should be noted that while both voltages $V_1$ and $V_2$ are of the same polarity to operate the transistor amplifier 30, these voltages need not have a predetermined polarity relationship to one another in order to have the amplifier conduct.

In FIG. 2, there is shown the stage 10 biased for operation as a memory sense amplifier by a pair of voltage sources, labeled as +VBias and +*Vcc* in FIG. 2.

More particularly, the values of biasing voltage sources, VBias and *Vcc*, applied to terminals 50 and 62 and values of source impedances 52 and 60 are selected such that when the amplifier stage 10 has no input signals applied to terminals 38 and 40 i.e., $V_1$ and $V_2 = 0$), amplifier 30 is in a conducting but not saturated condition. Further, the voltage output at terminal 46 is at a predetermined value as given by equation (1).

In the environment shown relative to FIG. 2, it is assumed that the differential amplifier stage 10 is utilized to detect signals supplied by a memory element or the like. Therefore, a source 56 may, for example, in its simplest form comprise a pair of sense lines from the memory element and/or system. Accordingly, the source 56 supplies positive going and negative going signals, referenced as V1 and V2 in FIG. 2, respectively to the terminals 38 and 40. Depending on the current gain of amplifier 30, these signals may be on the order of millivolts.

The illustrated embodiment of FIG. 2 operates identically to the embodiment of FIG. 1. Therefore, when the input signals $V_1$ and $V_2$ are applied to both terminals of the amplifier stage 10, their combined effect is to provide an output voltage which is proportional to the algebraic difference between the input signals in accordance with equation (1) where *DV* corresponds to the voltage drop (i.e. Vbe) between the base and emitter electrodes 27*b* and 27*e* of transistor amplifier 30.

The amplifier of the subject invention, as described, provides a high ratio of input signal swing to supply voltage. In fact, this high ratio may be maintained even with supply voltages as low as 2 or 3 volts. Further, and more importantly, the input arrangement of the amplifier of the invention provides higher ratio of common mode rejection; this ratio being little affected by values of load impedance. Accordingly, several amplifying circuits of the subject invention can be buffered together and then combined to form a larger memory system. Other arrangements will be obvious to those skilled in the art.

It will be appreciated by those skilled in the art that various other changes may be made to the illustrated embodiments without departing from the spirit and scope of the invention. For example, alternate forms of biasing may be used in conjunction with the amplifier stage of the invention. In FIG. 2, for example, a single voltage source may be used to supply an appropriate voltage potential to terminals 50 and 62. Further, the need for a voltage source may be entirely eliminated when the amplifier terminals 38 and 40 are directly coupled to a previous amplifier stage. For example, the source 56 may be directly coupled to a first or intermediate differential amplifier stage conventional in design, which in turn has its outputs directly connected to the input terminals of amplifier stage 10.

In some instances, the amplifier of the invention may be employed to improve significantly the signal to noise ratio of a given prior art amplifier stage by passing each of the outputs of such stage through separate amplifiers of the subject invention. In addition, alternate modes of coupling may be employed for passing the amplifier output from terminal 46 to a utilization device.

The fact that the amplifier stage of the illustrated embodiments employed transistors should not be construed as limiting. Specifically, any amplifying device having the characteristics described, as for example, high current gain, may be also employed.

While in accordance with the provisions and statutes there has been illustrated and described the best forms of the invention known, certain changes may be made in the circuits described without departing from the spirit of the invention as set forth in the appended claims and that in some cases, certain features of the invention may be used to advantage without a corresponding use of other features.

Having described the invention, what is claimed as new and novel and for which it is desired to secure Letters Patent is:

I claim:

1. The combination comprising:
- an amplifying device including first, second, and third electrodes;
- input circuit means including first and second series connected impedance means;
- first voltage generating means connected for applying a first input signal to said input circuit means:
- third impedance means connecting said first electrode to a reference potential with said second impedance means;
- means connecting the junction of said first and second impedances to said second electrode for applying said first signal as a control input thereto;
- fourth impedance means connected to said third electrode; and,
- second voltage generating means connected for applying a second input signal through said fourth impedance means to said third electrode, said impedances being selected to have fixed values and said values of predetermined ones of said impedances being related in a predetermined manner for operating said amplifying means to produce an output signal at said third electrode which corresponds to the algebraic difference in amplitude between said first and second input signals and said first and second signals being of an amplitude and of the same polarity for biasing said amplifying means for linear operation.

2. A difference circuit for receiving input voltages *V*1 and *V*2 and for producing an output signal *Eo* proportional to the algebraic difference between said voltages, said circuit comprising:
- an amplifier having an input terminal and first and second output terminals;
- a first impedance means including series connected elements *Z*1 and *Z*2;
- a second impedance means including elements *Z*3 and *Z*4 connected to form series conductive path with said first and second output terminals;
- first and second means for applying said voltages *V*1 and *V*2, across said first and second means, respectively;
- means for coupling the junction between *Z*1 and *Z*2 to the input terminal of said amplifier; and
- means for deriving output signal *Eo* from said first output terminal;
- said elements *Z*1 and *Z*2 and said elements *Z*4 and *Z*3 being related by a constant factor *P* so as to satisfy the equation: $Z2 . Z4/Z3 . (Z1=Z2)=1$ wherein $Z1=P.Z2$ and $Z4=(P1)Z3$ and the voltages *V*1 and *V*2 are of the same polarity and of an amplitude for biasing said amplifier for linear operation.

3. The difference circuit of claim 2 further including a constant voltage device connecting said junction to said input terminal, said device for subtracting a constant voltage from said voltage *V*1 which is less in magnitude than said voltage *V*1 thereby extending the operating range of said amplifier for producing said output signal *Eo* in response to larger values of said voltage *V*1 and said input terminal, first and second output terminals respectively correspond to base, collector and emitter electrodes.

4. The amplifier of claim 2 wherein said impedances are totally resistive and conform to the following:

$Z1=R1$,
$Z2=R2$,
$Z3=R3$, and
$Z4=R4$ wherein $R1=P \cdot R2$ and
$R4=(P+1)$ R3 and *P* is any independent constant.

5. In combination:
- a voltage divider for receiving a first input voltage *V*1, said voltage divider including first and second fixed impedances;
- an impedance means for receiving a second input voltage *V*2, said impedance means including first and second fixed impedances, said first impedance being directly connected in common with one end of said second impedance of said voltage divider;
- an amplifier having an input control terminal and first and second output terminals, said input control terminal being connected for receiving the divided voltage produced by said divider proportional to $V1/(P+1)$, where *P* is any independent constant and $(P+1)$ is the ratio between said first and second impedances;
- and said impedance means being connected for producing an output difference signal *Eo*, said first and second impedances of said impedance means being connected in series with said first and second terminals for driving a current $i_c$ from said amplifier such that said current $i_c$ is proportional to $V1/Z1 \cdot (P+1)$, where *Z*1 is the value of said first impedance in said impedance means and said output signal $E_o$ is proportionally defined as:
- $Eo \sim V2 - i_c \cdot Z2$, where *Z*2 is the value of said second impedance of said impedance means, and ~ means approximately equals said value, said impedance Z2 being selected according to the relationship:
- $Z2=Z1 \cdot (P+1)$ whereby the output signal *Eo* becomes ~ V2–V1 and said input voltages *V*1 and $V_2$ are of an amplitude for biasing said amplifier for linear operation.

6. A difference amplifier comprising:
- current amplifying means having an input control terminal, a common terminal, and at least one output terminal;
- first and second means, the junction of said first and second impedance means being connected to said control terminal;

third impedance means connecting said common terminal to a reference potential in common with one end of said second impedance means;

first means for applying a first input signal of a first polarity through said first impedance means to said control terminal;

fourth impedance means connected to said output terminal;

voltage source biasing means adapted to supply operating voltages to said amplifying means, said biasing means being directly connected to said first and said fourth impedance means for operating said amplifier means within its linear range; and, second means for applying a second input signal opposite in polarity to said first input signal through said fourth impedance means, all said impedances means being selected to have fixed values and said values of predetermined ones being related in a predetermined manner for operating said amplifying means to produce an output signal proportional to the algebraic difference in amplitude between said first and second input signals.

7. The difference amplifier of claim 6 wherein said first impedance means is a first resistor connected between said first means and said junction, said second impedance means is a second resistor connected between said junction and said reference potential, said third impedance means is a third resistor connected between said common terminal and said reference potential, and said fourth impedance is a resistor connected between said second means and said output terminal.

8. The amplifier of claim 6 wherein said amplifying means includes a single transistor having base, emitter, and collector electrodes corresponding to said control, common, and output terminals respectively.

9. The amplifier of claim 6 wherein the voltage on said control terminal is proportional to said first input signal and the current through said fourth impedance is entirely a function of said current flowing through said third impedance.

10. The amplifier of claim 6 wherein said first input signal corresponds to a voltage $V1$ and said second input signal corresponds to a voltage $V2$, said voltages $V1$ and $V2$ for linear operation of said amplifier having values between the range whose limits are defined by the relationships:

$V1=DV\cdot(P+1)$ and $V2=V1\cdot(P+2)/(P+1)-DV\cdot(P+2)$ where $P$ is any independent constant and $DV$ is the voltage drop between said input control terminal and said common terminal.

11. The amplifier of claim 5 wherein said first and second means comprise signal sources which generate said signals of opposite polarity and wherein said first means is directly coupled to said input control terminal through said first impedance means and said second means is directly coupled to said one output terminal through said fourth impedance means.

12. The amplifier of claim 6 wherein said first input signal is defined as a voltage $V1$, said second input signal is defined as a voltage $V2$, and said output signal is defined as a voltage, $Eo$, which is given by the relationship $Eo=V2-V1+DV\cdot(P+1)$ where $P$ is any independent constant and DV is the voltage drop between said input control terminal and said common terminal.

13. A difference amplifier comprising:

current amplifying means having an input control terminal, a common terminal and at least one output terminal;

first and second impedances, the junctions of said first and second impedances being connected to said control terminal;

a third impedance connecting said common terminal to a reference potential in common with one end of said second impedance;

first means for applying a first input signal of a first polarity through said first impedance to said control terminal;

a fourth impedance connected to said output terminal;

voltage source biasing means adapted to supply operating voltages to said amplifying means, said biasing means being directly connected to said first and said fourth impedances for operating said amplifier means within its linear range;

second means for applying a second input signal opposite in polarity to said first input signal through said fourth impedance; and, said impedances being selected to have fixed values for operating said amplifying means to produce an output signal proportional to the algebraic difference in amplitude between said first and second input signals, said values of impedances conforming to the following:

said first impedance $= Z1$;

said second impedance $= Z2$;

said third impedance $= Z3$;

said fourth impedance $= Z4$; and wherein said impedance values are related as follows:

$Z2\cdot Z4/Z3\cdot(Z1+Z2)=1$.

14. The amplifier of claim 13 wherein said impedances are related as follows:

$Z1=K1Z2$, and $Z4=K2Z3$ where $K1$ and $K2$ are constants.

15. The amplifier of claim 14 wherein $K2=(K1+1)$.

16. A difference amplifier comprising:

current amplifying means having an input control terminal, a common terminal, and at least one output terminal;

first and second impedance means, the junction of said first and second impedance means being connected to said control terminal;

third impedance means connecting said common terminal to a reference potential in common with one end of said second impedance means;

first means for applying a first input signal of a first polarity through said first impedance means to said control terminal;

fourth impedance means connected to said output terminal;

voltage source biasing means adapted to supply operating voltages to said amplifying means, said biasing means being directly connected to said first and fourth impedance means for operating said amplifier means within its linear range;

second means for applying a second input signal opposite in polarity to said first input signal through said fourth impedance means, all of said impedance means being selected to have fixed values with said values of predetermined ones of said impedance means being related in a predetermined manner for operating said amplifying means to produce an output signal proportional to the algebraic difference in amplitude between said first and second input signals; and, a constant voltage device connecting said junction to said control terminal, said device for subtracting a constant voltage from said first input signal which is less in magnitude than said input signal thereby extending the operating range of said difference amplifier for producing said output signal in response to larger values of said first signal applied by said first means.

17. The amplifier of claim 16 wherein said constant voltage device is a semiconductor diode.

* * * * *

UNITED STATES PATENT OFFICE
CERTIFICATE OF CORRECTION

Patent No. 3,660,774 Dated May 2, 1972

Inventor(s) Joseph J. Eachus

It is certified that error appears in the above-identified patent and that said Letters Patent are hereby corrected as shown below:

Column 6, line 21, "Z4=(P1)Z3" should appear -- Z4=(P+1)·Z3 --; line 58, "driving" should appear -- deriving --; line 68, "$V_2$" should appear -- V2 --; line 73, after "first and second" insert -- impedance --.

Signed and sealed this 12th day of December 1972.

(SEAL)
Attest:

EDWARD M.FLETCHER,JR.
Attesting Officer

ROBERT GOTTSCHALK
Commissioner of Patents